(12) United States Patent
Akasaka et al.

(10) Patent No.: US 7,718,497 B2
(45) Date of Patent: May 18, 2010

(54) METHOD FOR MANUFACTURING SEMICONDUCTOR DEVICE

(75) Inventors: Yasushi Akasaka, Yamanashi (JP);
Noriaki Fukiage, Hyogo (JP);
Yoshihiro Kato, Yamanashi (JP);
Kazuhide Hasebe, Yamanashi (JP);
Pao-Hwa Chou, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/130,296

(22) Filed: May 30, 2008

(65) Prior Publication Data

US 2008/0299728 A1 Dec. 4, 2008

(30) Foreign Application Priority Data

May 31, 2007 (JP) .............................. 2007-145646

(51) Int. Cl.
*H01L 21/8234* (2006.01)
(52) U.S. Cl. .................. 438/275; 257/225; 257/390
(58) Field of Classification Search ........................ None
See application file for complete search history.

(56) References Cited

U.S. PATENT DOCUMENTS

| 6,091,152 | A | * | 7/2000 | Iwata | ........................ 257/770 |
| 2006/0094177 | A1 | * | 5/2006 | Ohta | ........................ 438/197 |
| 2007/0034963 | A1 | | 2/2007 | Sudo | |
| 2008/0076213 | A1 | * | 3/2008 | Hsieh et al. | ................ 438/197 |
| 2008/0090350 | A1 | * | 4/2008 | Yan et al. | .................... 438/257 |
| 2008/0145536 | A1 | * | 6/2008 | Zhang et al. | ........... 427/255.38 |
| 2008/0191284 | A1 | * | 8/2008 | Baiocco et al. | ............. 257/369 |
| 2008/0246056 | A1 | * | 10/2008 | Chan et al. | .................. 257/190 |

FOREIGN PATENT DOCUMENTS

| JP | 07-106566 A | 4/1995 |
| JP | 11-195785 A | 7/1999 |
| JP | 2004-311764 A | 11/2004 |
| JP | 2007049166 | 2/2007 |
| JP | 2007145646 | 5/2007 |

OTHER PUBLICATIONS

Chen, et al, "Stress Proximity Technique for Performance Improvement with Dual Stress Linar at 45nm Technology and Beyond," Symposium on VLSI Technology Digest of Technical Papers, 2006.
Japanese Office action for 2007-145646, dated Jun. 9, 2009.

* cited by examiner

*Primary Examiner*—Ha Tran T Nguyen
*Assistant Examiner*—Shantanu C Pathak
(74) *Attorney, Agent, or Firm*—Pearne & Gordon LLP

(57) ABSTRACT

A semiconductor device manufacturing method includes: forming a sidewall spacer on a sidewall surface of a gate electrode; forming a pair of second conductive type source and drain regions in an active region; covering top surfaces of a semiconductor layer, a device isolation region, the sidewall spacer and the gate electrode with a metal film; reducing resistance of the source and drain regions and the gate electrode partially by making the metal film react with the semiconductor layer and the gate electrode; and removing an unreacted portion of the metal film and the sidewall spacer simultaneously by using an etchant which readily etches the unreacted portion of the metal film and the sidewall spacer while hardly etching the device isolation region, resistance-reduced portions of the gate electrode and resistance-reduced portions of the source and drain regions.

4 Claims, 5 Drawing Sheets

METHOD FOR MANUFACTURING SEMICONDUCTOR DEVICE

FIELD OF THE INVENTION

The present disclosure relates to a manufacturing method for a semiconductor device; and, more particularly, to a technique for removing sidewall spacers therefrom.

BACKGROUND OF THE INVENTION

Recently, to improve an operating speed of a field effect transistor (FET) or to increase a driving current thereof, various attempts have been made to apply a stress to a channel of the FET. By applying the stress to the channel, the mobility of charges in the channel can be improved, as compared to the case without applying a stress. This technique is disclosed in Japanese Patent Laid-open Application No. 2007-49166 (Patent document 1) or in X. Chen et al., "Stress Proximity Technique for Performance Improvement with Dual Stress Liner at 45 nm Technology and Beyond", 2006 Symposium on VLSI Technology Digest of Technical Papers (Non-patent Document 1).

Further, Patent Document 1 or Non-patent Document 1 discloses a technique referred to as a "Stress Proximity Technique (SPT)" as a way to apply the stress to the channel efficiently. The SPT involves covering top surfaces of source and drain regions and a gate electrode of a FET with a member called a stress liner after removing a pair of sidewall spacers formed on both sides opposite sidewall surfaces of the gate electrode. By removing the sidewall spacers, the stress liner can be positioned more proximal to the channel, whereby a more efficient application of the stress to the channel is enabled.

The sidewall spacers in Patent Document 1 are made of silicon nitride (SiN) or boron silicate glass (BSG) (see paragraph 0017). SiN is removed by using a phosphoric acid based etchant, and BSG is removed by using a fluoric acid based etchant. However, the phosphoric acid based etchant dissolves a silicide layer, and the fluoric acid based etchant dissolves a silicon oxide based film, especially, a device isolation region. The silicide layer is a layer which functions to reduce the resistance of the source and drain regions or the gate electrode. If unevenness in the thickness of the silicide layer is caused as a result of the dissolution of the silicide layer, it would be difficult to obtain a desired transistor characteristic stably and reproducibly even if the transistor works. The device isolation region is a film which separates the source and drain regions of the transistor. If the device isolation region is etched, a circuit failure such as a short between transistors would be caused.

Further, to obtain the desired transistor characteristic stably and reproducibly or to minimize the etching of the device isolation region, the manufacturing process needs to be controlled strictly, and this requirement may be met at the expense of a yield of integrated circuits or a throughput thereof.

Though it is desirable to remove the sidewall spacers selectively against the device isolation region, the gate electrode and the silicide layer, this technique cannot be realized with a conventionally known material. That is, mass production by the SPT under current conditions is still difficult to realize.

Further, Non-patent Document 1 does not disclose anything about the material for the sidewall spacers.

BRIEF SUMMARY OF THE INVENTION

In view of the foregoing, the present disclosure provides a manufacturing method for a semiconductor device, capable of realizing a desired characteristic of the semiconductor device stably and reproducibly after removing sidewall spacers from the semiconductor device, while also enabling simplification of the management of a manufacturing process.

In accordance with a first aspect of the present invention, there is provided a method for manufacturing a semiconductor device, including: forming a gate electrode on an active region of a semiconductor layer having a device isolation region in addition to the active region; forming a sidewall spacer on a sidewall surface of the gate electrode by using a material different from those of the semiconductor layer, the device isolation region and the gate electrode; forming a pair of source and drain regions in the active region by introducing impurities into the active region while using the device isolation region, the gate electrode and the sidewall spacer as a mask; covering top surfaces of the semiconductor layer, the device isolation region, the sidewall spacer and the gate electrode with a metal film; reducing resistance of the source and drain regions and the gate electrode partially by making the metal film react with the semiconductor layer and the gate electrode; and removing an unreacted portion of the metal film and the sidewall spacer simultaneously by using an etchant which readily etches the unreacted portion of the metal film and the sidewall spacer while hardly etching the device isolation region, resistance-reduced portions of the gate electrode and resistance-reduced portions of the source and drain regions.

In accordance with a second aspect of the present invention, there is provided a method for manufacturing a semiconductor device, including: forming a gate electrode on each of a first conductive type active region and a second conductive type active region of a semiconductor layer having device isolation regions in addition to the first and second conductive active regions; forming a sidewall spacer on each sidewall surface of the gate electrodes formed on the first and second conductive type active regions by using a material different from those of the semiconductor layer, the device isolation regions and the gate electrodes; forming a blanket film on the semiconductor layer, the device isolation regions, the sidewall spacers and the gate electrodes by using a material different from those of the sidewall spacers; covering, with a first mask material, a portion of the semiconductor layer where a first conductive type transistor is to be formed; forming a pair of second conductive type source and drain regions in the first conductive type active region by introducing impurities into the first conductive type active region through the blanket film while using the device isolation regions, the gate electrode formed on the first conductive type active region, the sidewall spacers formed on the sidewall surfaces of the gate electrode and the first mask material as a mask; covering, with a second mask material, a portion of the semiconductor layer where a second conductive type transistor is to be formed, after removing the first mask material; forming a pair of first conductive type source and drain regions in the second conductive type active region by introducing impurities into the second conductive type active region through the blanket film while using the device isolation regions, the gate electrode formed on the second conductive type active region, the sidewall spacers formed on the sidewall surfaces of the gate electrode and the second mask material as a mask; removing the blanket film by using an etchant which readily etches the blanket film while hardly etching the sidewall spacers, after removing the second mask material; covering top surfaces of the semiconductor layer, the device isolation regions, the sidewall spacers and the gate electrodes with a metal film; reducing resistance of the source and drain regions and the gate electrodes partially by making the metal film react with the semiconductor layer and the gate electrodes; and removing an unreacted portion of the metal film and the sidewall spacers simultaneously by using an etchant which readily etches the unreacted portion of the metal film and the sidewall spacers while hardly etching the device isolation regions, resistance-reduced portions of the gate electrodes and resistance-reduced portions of the source and drain regions.

In accordance with the embodiment of the present invention, it is possible to provide a manufacturing method for a semiconductor device, capable of realizing a desired characteristic of the semiconductor device stably and reproducibly, while also enabling simplification of the control of a manufacturing process.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present invention will be described in detail with reference to the accompanying drawings so that the present invention may be readily implemented by those skilled in the art.

FIGS. 1 to 8 provide cross sectional views to describe a major process sequence of a manufacturing method for a semiconductor device in accordance with an embodiment of the present invention.

Figure 1:
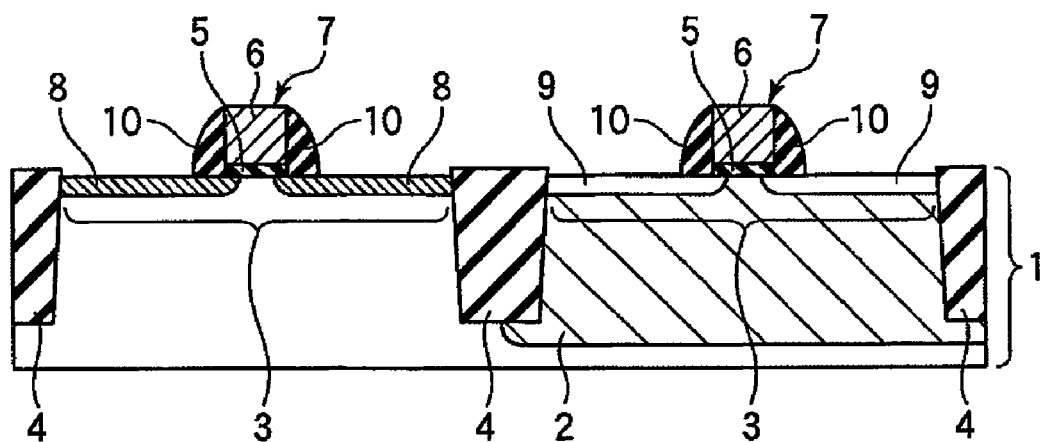
FIG. 1 provides a cross sectional view to describe a major process sequence of a manufacturing method for a semiconductor device in accordance with an embodiment of the present invention.

First, as shown in FIG. 1, in a semiconductor substrate 1 of a first conductive type (p type in this embodiment), a well region 2 of a second conductive type (n type in this embodiment) is formed. The semiconductor substrate 1 is, for example, a silicon substrate or a strained silicon substrate. One example of the strained silicon substrate is a silicon germanium (SiGe) substrate. Subsequently, device isolation regions 4 for defining active regions 3 are formed in the surface of the semiconductor substrate 1. One example of such device isolation region 4 is a shallow trench isolation (STI). Subsequently, a gate insulating film 5 is formed on the surface of the active regions 3 of the semiconductor substrate 1. The gate insulating film 5 is, for example, a silicon oxide film or a film having a higher dielectric constant than the silicon oxide film. Then, a conductive film 6 is formed on the gate insulating film 5. The conductive film 6 is, for example, a conductive polysilicon film. Thereafter, the conductive film 6 and the gate insulating film 5 are patterned by using a photolithography technique, so that a gate electrode 7 is formed on each of the P-type semiconductor substrate 1 and the n-type well region 2. Subsequently, a mask material (not shown) is formed on the top surface of the semiconductor substrate 1, and a window, which corresponds to a portion where an insulating gate type FET (MOSFET or MISFET) of an n-channel type is to be formed, is formed in the mask material. Thereafter, by using the mask material (not shown), the device isolation regions 4 exposed through the window of the mask material and the gate electrode 7 formed on the semiconductor substrate 1 as a mask, n-type impurities are introduced into the active region 3 of the semiconductor substrate 1, so that an N-type extension region 8 is formed. Then, after removing the mask material (not shown), a new mask material (not shown) is formed on the top surface of the semiconductor substrate 1, and a window, which corresponds to a portion where an insulating gate type FET (MOSFET or MISFET) of a p-channel type is to be formed, is formed in the new mask material. Then, by using the new mask material (not shown), the device isolation regions 4 exposed through the window of the new mask material and the gate electrode 7 formed on the well region 2 as a mask, p-type impurities are introduced into the active region 3 of the well region 2, so that a p-type extension region 9 is formed. The mask material is, for example, a photoresist film, and the n-type impurities and the p-type impurities are, for example, arsenic (As) and boron (B), respectively. The introduction of the impurities can be carried out by using, for example, an ion implantation method. Further, though it is desirable to form, if necessary, the extension regions 8 and 9 as in the present embodiment, they are not essential elements and can be omitted. Then, a film serving as sidewall spacers is formed on the entire surface of semiconductor substrate 1. In this example, the sidewall spacers are formed by using a film having etching selectivity against each of the device isolation region 4, the gate electrode 7 and a silicide layer to be described later and capable of removing only the sidewall spacers selectively against those members. For example, a material of the film is GeCOH or SiBN. Subsequently, the film, which will be the sidewall spacers, is etched back by anisotropic etching. One example of the anisotropic etching is reactive ion etching (RIE). As a result, a sidewall spacer 10 is formed on each sidewall surface of the gate electrode 7 formed on the semiconductor substrate 1 and the gate electrode 7 formed on the well region 2.

Figure 2:
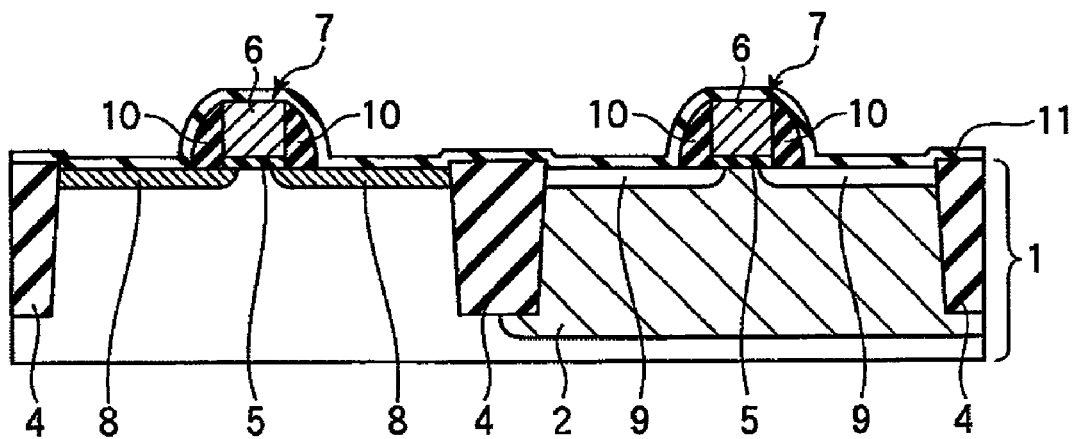
FIG. 2 sets forth a cross sectional view to describe a major process sequence of the manufacturing method for the semiconductor device in accordance with the embodiment of the present invention.

Subsequently, as shown in FIG. 2, a blanket film 11 formed of a different material from the sidewall spacers is formed on the top surface of the semiconductor substrate 1, so that the semiconductor substrate 1, the well region 2, the device isolation regions 4, the gate electrodes 7 and the sidewall spacers 10 are covered with the blanket film 11. The blanket film 11 protects the semiconductor substrate 1, the well region 2, the device isolation regions 4, the gate electrodes 7 and the sidewall spacers 10 when mask materials are removed in a subsequent process of forming source and drain regions. The thickness of the blanket film 11 is, for example, about 2 to 3 nm, and the blanket film 11 is made of, for example, a silicon oxide based film.

Figure 3:
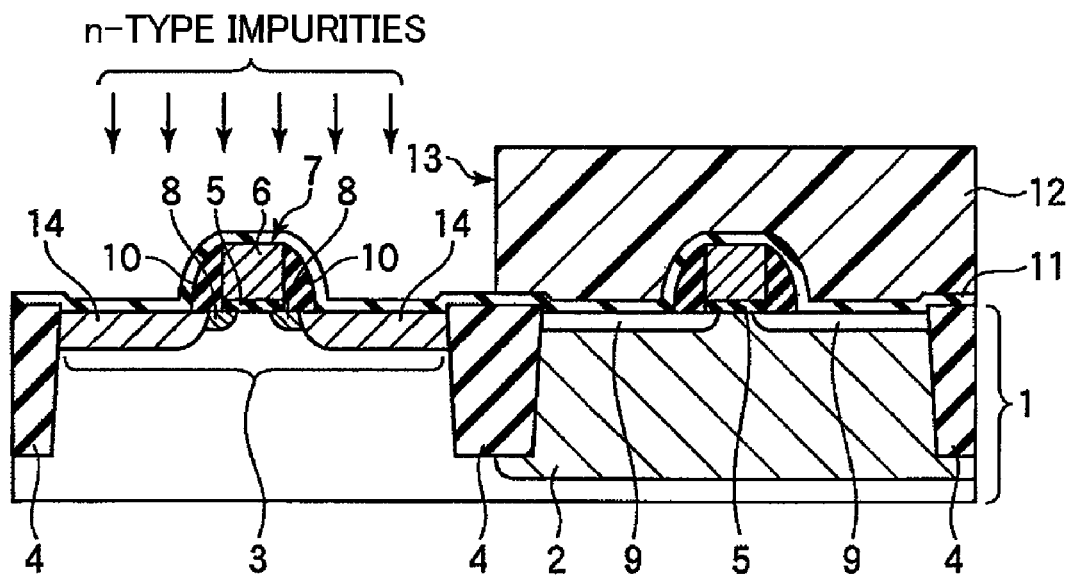
FIG. 3 presents a cross sectional view to describe a major process sequence of the manufacturing method for the semiconductor device in accordance with the embodiment of the present invention.

Then, as shown in FIG. 3, a mask material 12 is formed on the semiconductor substrate 1, i.e., on the top surface of the blanket film 11 in this embodiment, and a window 13, which corresponds to the portion where an insulating gate type FET of an n-channel type is to be formed, is formed in the mask material 12. Thus, at least a portion of the active region 3 of the well region 2, the gate electrode 7 formed on the well region 2 and the sidewall spacers 10 formed on both sidewall surfaces of the gate electrode 7 are covered with the mask material 12. Thereafter, by using the mask material 12, the device isolation regions 4 exposed through the window 13, the gate electrode 7 formed on the semiconductor substrate 1 and the sidewall spacers 10 formed on both sidewall surfaces of this gate electrode 7 as a mask, n-type impurities are introduced into the active region 3 of the semiconductor substrate 1 through the blanket film 11, so that a pair of n-type source and drain regions 14 are formed. The mask material 12 is, for example, a photoresist film, and the n-type impurities are, for example, arsenic (As). One example of introducing the impurities is an ion implantation method.

Figure 4:
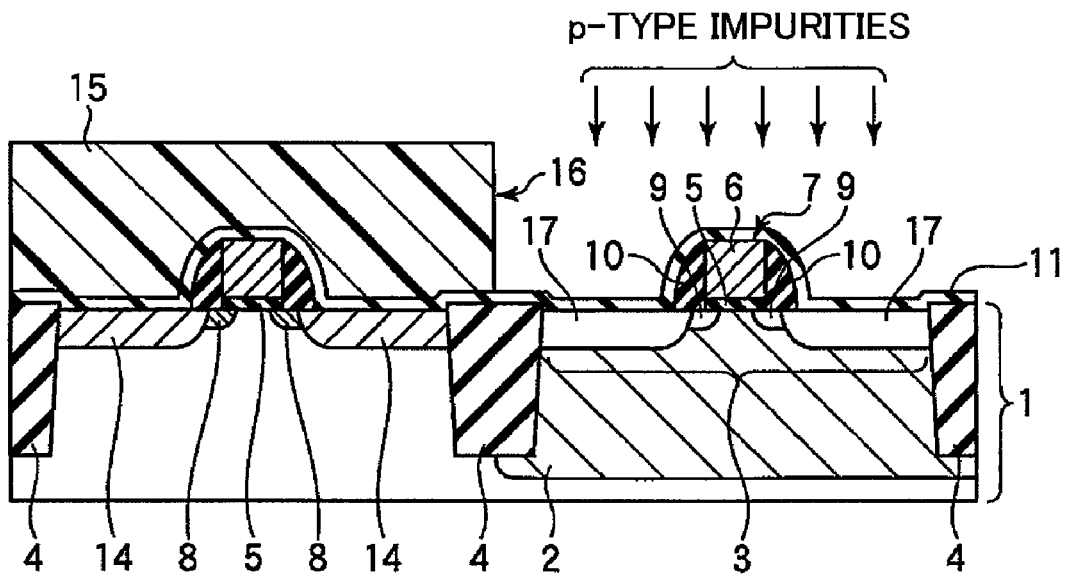
FIG. 4 depicts a cross sectional view to describe a major process sequence of the manufacturing method for the semiconductor device in accordance with the embodiment of the present invention.

Thereafter, as illustrated in FIG. 4, the mask material 12 is removed. For example, when the mask material 12 is a photoresist film, it can be removed by ashing. Then, the top surface of the blanket film 11 is cleaned by, for example, a wet cleaning method. A cleaning solution used for the wet cleaning is, for example, a sulfuric-acid and hydrogen-peroxide mixture (SPM). The SPM hardly etches Si, $SiO_2$ and SiN. Then, a mask material 15 is formed on the semiconductor substrate 1, i.e., on the top surface of the blanket film 11 in this embodiment. Afterward, a window 16, which corresponds to the portion where an insulating gate type FET of a p-channel type is to be formed, is formed in the mask material 15. As a result, at least a portion of the active region 3 of the semiconductor substrate 1, the gate electrode 7 formed on the semiconductor substrate 1 and the sidewall spacers 10 formed on both sidewall surfaces of the gate electrode 7 are covered with the mask material 15. Then, by using the mask 15, the device isolation regions 4 exposed through the window 16, the gate electrode 7 formed on the well region 2 and the sidewall spacers formed on both sidewall surfaces of this gate electrode 7 as a mask, p-type impurities are introduced into the active region 3 of the well region 2 through the blanket film 11, so that a pair of p-type source and drain regions 17 are formed. Like the mask material 12, the mask material 15 is a photoresist film, for example, and the p-type impurities are boron (B) for example. The introduction of the impurities is carried out by an ion implantation method, for example.

Figure 5:
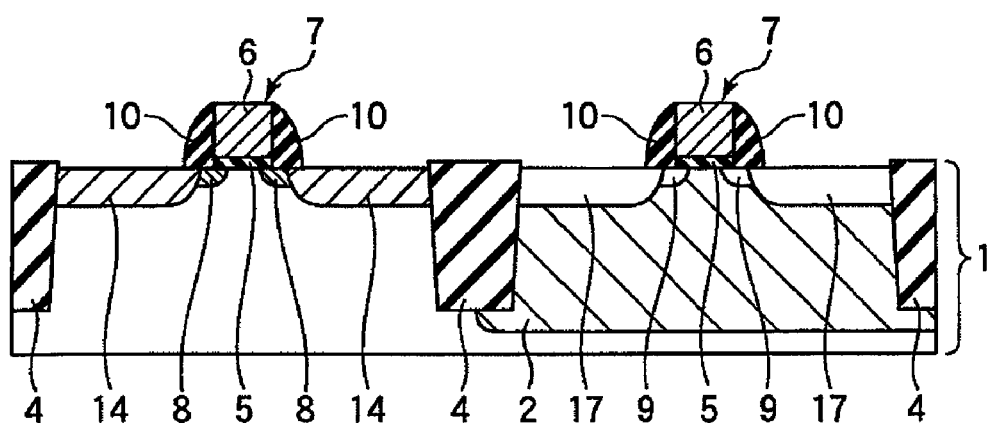
FIG. 5 offers a cross sectional view to describe a major process sequence of the manufacturing method for the semiconductor device in accordance with the embodiment of the present invention.

Subsequently, as shown in FIG. 5, the mask material 15 is removed by the same method as used to remove the mask material 12, and the top surface of the blanket film 11 is cleaned by the same method as explained above. Thereafter, the blanket film 11 is removed by using an etchant which hardly etches the sidewall spacers 10 but readily etches the blanking film 11. As one example of such an etchant, when the blanket film 11 is a silicon oxide based film and the sidewall spacers 10 are GeCOH or SiBN, there can be used a fluoric acid based etchant, e.g., dilute hydrofluoric acid. GeCOH and SiBN are resistant to the fluoric acid based etchant, e.g., the dilute hydrofluoric acid. Further, the silicon oxide based film is soluble in the fluoric acid based etchant, e.g., the dilute hydrofluoric acid.

Figure 6:
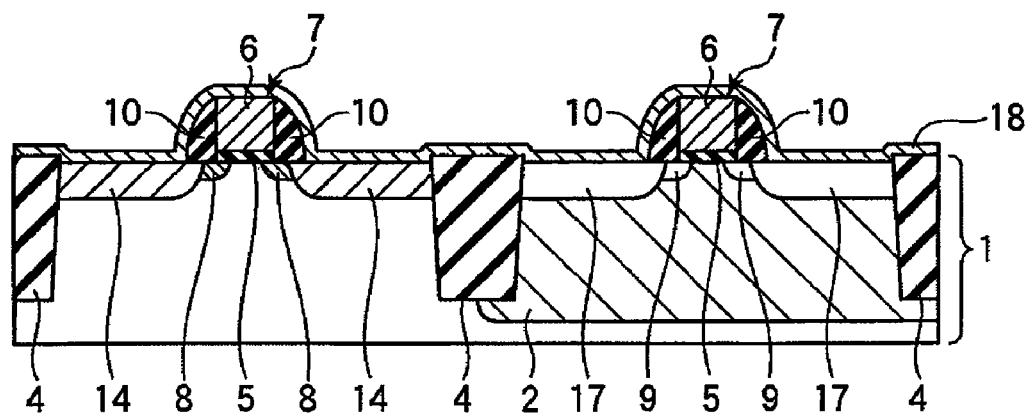
FIG. 6 provides a cross sectional view to describe a major process sequence of the manufacturing method for the semiconductor device in accordance with the embodiment of the present invention.

Then, as illustrated in FIG. 6, natural oxide films present on the top surfaces of the gate electrodes 7, the semiconductor substrate 1 and the well region 2 are removed, so that the top surfaces of the gate electrodes 7, the semiconductor substrate 1 and the well region 2 are exposed. The natural oxide films may be desirably removed by etching the natural oxide films by using, for example, a fluoric acid based etchant such as dilute hydrofluoric acid. Thereafter, a metal film 18 is formed on top of the semiconductor substrate 1 so that it covers the top surfaces of the semiconductor substrate 1, the device isolation regions 4, the sidewall spacers 10 and the gate electrodes 7. The metal film 18 is made of a metal which reacts with a semiconductor, e.g., silicon (Si) to form silicide. Such metal can be, for example, nickel (Ni). Further, in addition to nickel (Ni), cobalt (Co) or titanium (Ti) may also be employed.

Figure 7:
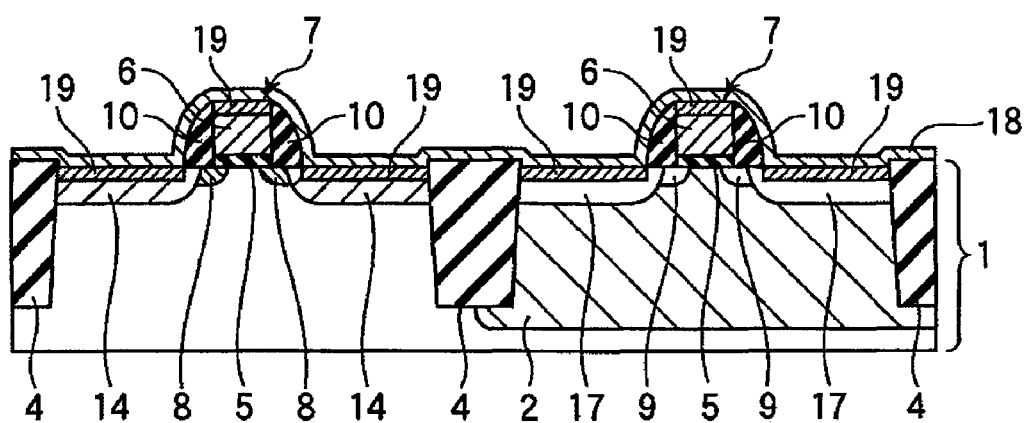
FIG. 7 illustrates a cross sectional view to describe a major process sequence of the manufacturing method for the semiconductor device in accordance with the embodiment of the present invention.

Afterward, as shown in FIG. 7, the semiconductor substrate 1 is subjected to a heat treatment, in which the metal film 18 reacts with the semiconductor substrate 1, the well region 2 and the gate electrodes 7. As a result, a silicide layer 19 is formed on the top surface of each of the semiconductor substrate 1, the well region 2 and the gate electrodes 7 in a self-aligned manner (silicide process). The silicide thus formed may be nickel silicide (NiSi) when the semiconductor is silicon (Si) and the metal film 18 is nickel (Ni). As a result of the formation of the silicide layers 19, the resistances of the source and drain regions 14 and 17 and the gate electrodes 7 can be partially reduced.

Figure 8:
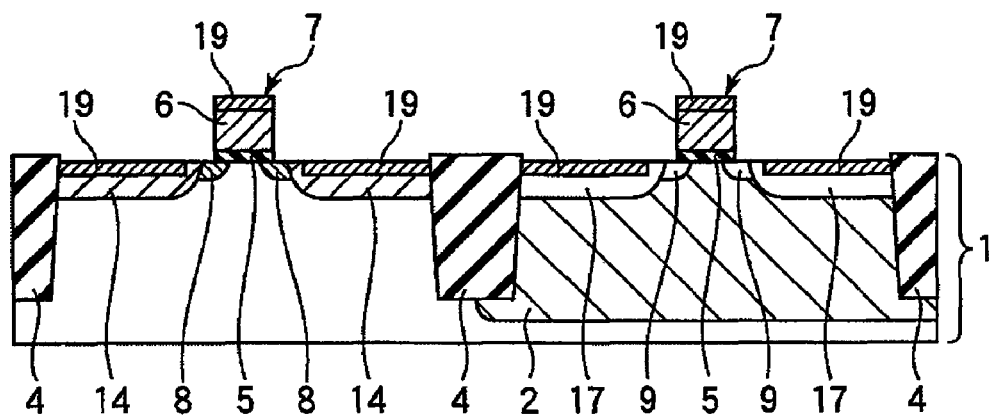
FIG. 8 presents a cross sectional view to describe a major process sequence of the manufacturing method for the semiconductor device in accordance with the embodiment of the present invention.
Figure 9:
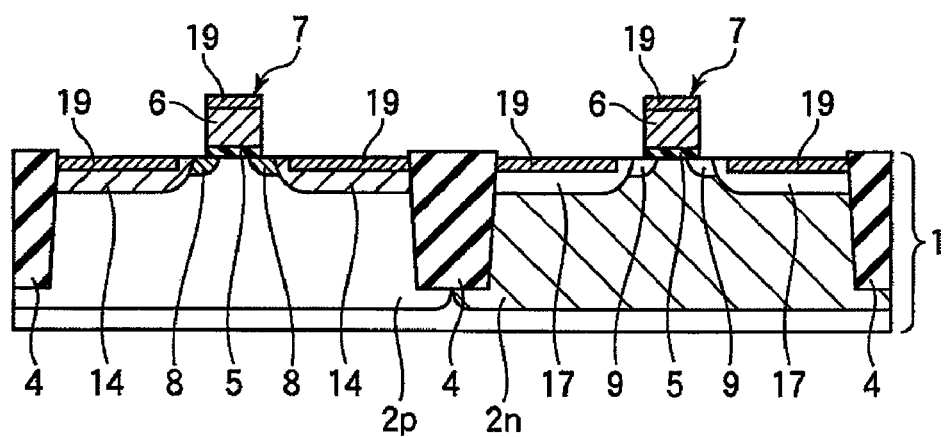
FIG. 9 shows a cross sectional view to illustrate a semiconductor device in accordance with a modification example the embodiment of the present invention.
Figure 10:
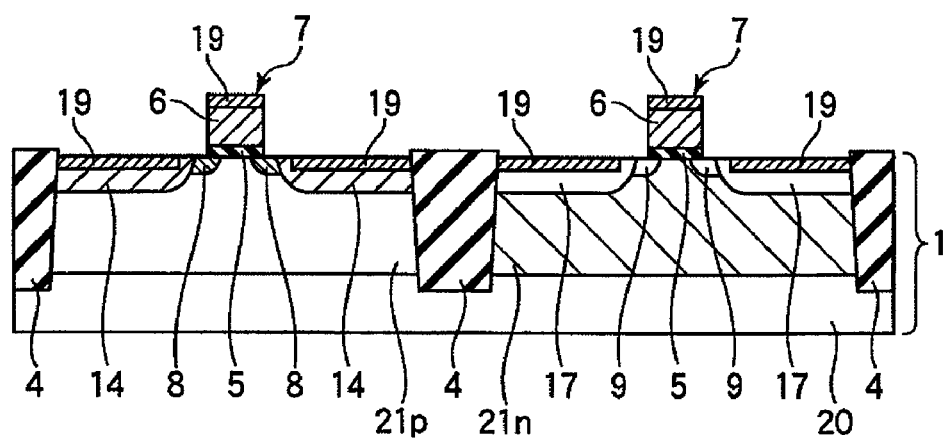
FIG. 10 sets forth a cross sectional view to illustrate a semiconductor device in accordance with another modification example of the embodiment of the present invention.

Then, as illustrated in FIG. 8, an unreacted portion of the metal film 18 and the sidewall spacers 10 are removed by using an etchant which readily etches the unreacted portion of the metal film 18 and the sidewall spacers 10 while hardly etching the silicide layers 19 and the device isolation regions 4. In the present embodiment, the unreacted portion of the metal film 18 and the sidewall spacers 10 are removed simultaneously. The etchant can be, for example, a SPM when the silicide is nickel silicide (NiSi), and the device isolation regions 4 are silicon oxide based films, and the sidewall spacers 10 are GeCOH or SiBN. The SPM hardly etches Si, $SiO_2$, SiN and NiSi. Instead, the SPM etches GeCOH, SiBN and Ni effectively. Further, another example of the etchant can be an ammonia and hydrogen-peroxide mixture (APM) or the like.

Thereafter, a desired semiconductor device, i.e., the insulating gate type field effect transistor (MOSFET or MISFET) in this embodiment can be formed through a well-known manufacturing process (not illustrated). This manufacturing process involves forming a stress liner on the semiconductor substrate 1, the well region 2, the device isolation regions 4 and the gate electrodes 7 as disclosed in Patent Document 1 or Non-patent Document 1; forming an interlayer insulating film; forming, in the interlayer insulating film, contact/via holes which extends to the silicide layers 19; and forming interconnections in the contact/via holes.

The semiconductor device manufacturing method in accordance with the embodiment of the present invention basically includes a process sequence as below:

(1) forming the gate electrodes 7

(2) forming the sidewall spacers 10 on the sidewall surfaces of the gate electrodes 7 by using a material which has etching selectivity against each of the device isolation regions 4 and the silicide layers 19 (in this embodiment, either one of GeCOH and SiBN is used as the sidewall spacers 10)

(3) forming the source and drain regions 14 (or 17)

(4) covering the source and drain regions 14 (or 17), the device isolation regions 4, the sidewall spacers 10 and the gate electrodes 7 with the metal film 18

(5) making the metal film 18 react with the source and drain regions 14 (or 17) and the gate electrodes 7 to thereby reduce the resistances of the source and drain regions 14 (or 17) and the gate electrodes 7 partially (silicide layers 19)

(6) removing the unreacted portion of the metal film 18 and the sidewall spacers 10 at the same time by using the etchant which etches the unreacted portion of the metal film 18 and the sidewall spacers 10 effectively while hardly etching the resistance-reduced portions (silicide layers 19) of the gate electrodes 7 and the resistance-reduced portions (silicide layers 19) of the source and drain regions 14 (or 17) (SPM or APM is used as the etchant).

Particularly, in accordance with the present embodiment, it is possible to remove the sidewall spacers 10 selectively against the device isolation regions 4, the gate electrodes 7 and the silicide layers 19 by forming the sidewall spacers 10 with the material having etching selectivity against each of the device isolation regions 4 and the silicide layers 19. Thus, in a transistor from which the sidewall spacers 10 are removed, unevenness in the thickness of the silicide layers 19 can be suppressed, so that desired transistor characteristics can be obtained stably and reproducibly.

Furthermore, since the etching of the device isolation regions is also suppressed, a short circuit between transistors can also be prevented.

The sidewall spacers 10 can be implemented by using, for example, GeCOH or SiBN, as mentioned above. To suppress a thermal influence, it is desirable to use GeCOH which is deposited in an oxidative atmosphere of about 300° C., and to minimize the oxidation of the substrate, it is desirable to use SiBN.

Moreover, in accordance with the embodiment of the present invention, the unreacted portion of the metal film 18 and the sidewall spacers 10 are removed at the same time by using the etchant which readily etches the unreacted portion of the metal film 18 and the sidewall spacers 10 while hardly etching the device isolation regions 4 and the silicide layers 19. By removing the unreacted portion and the sidewall spacers 10 simultaneously, the management of the manufacturing process can be simplified, because the removal of the metal film 18 and the removal of the sidewall spacers 10 can be accomplished by using the same etchant without having to change it. The simplification of the process management contributes to reducing factors that cause a reduction of a production yield or throughput of integrated circuits.

The etchant enabling the simultaneous removal of the metal film 18 and the sidewall spacers 19 can be, for example, SPM or APM.

In accordance with the embodiment of the present invention, it is possible to provide a semiconductor device manufacturing method capable of realizing a desired transistor characteristic stably and reproducibly in a semiconductor device from which sidewall spacers are removed and simplifying the management of the manufacturing process.

The semiconductor device manufacturing method in accordance with the embodiment of the present invention has many advantages when it is applied to the manufacture of semiconductor devices, particularly, mass production thereof, using a SPT (Stress Proximity Technique).

While the invention has been described with respect to the embodiment, the present invention is not limited thereto but can be modified in various ways. That is, it is to be noted that the embodiment is nothing more than an example.

For example, in the embodiment, though the p-type semiconductor substrate 1 having the n-type well region 2 has been described as a semiconductor layer having the p-type and n-type active regions 3, it is also possible to use a semiconductor substrate 1 having a p-type well region 2*p* and an n-type well region 2*n* individually. Moreover, the semiconductor layer is not limited to the semiconductor substrate 1, and it can be a SOI (Silicon on Insulator) substrate having a p-type semiconductor layer 21*p* and an n-type semiconductor layer 21*n* on an insulating film 20 or a semiconductor thin film for forming a thin-film transistor.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A method for manufacturing a semiconductor device, comprising:

forming a gate electrode on an active region of a semiconductor layer having a device isolation region in addition to the active region;

forming a sidewall spacer on a sidewall surface of the gate electrode by using a material different from those of the semiconductor layer, the device isolation region and the gate electrode;

forming a pair of source and drain regions in the active region by introducing impurities into the active region while using the device isolation region, the gate electrode and the sidewall spacer as a mask;

covering top surfaces of the semiconductor layer, the device isolation region, the sidewall spacer and the gate electrode with a metal film;

reducing resistance of the source and drain regions and the gate electrode partially by making the metal film react with the semiconductor layer and the gate electrode; and removing an unreacted portion of the metal film and the sidewall spacer simultaneously by using an etchant which has a higher etching selectivity of the unreacted portion of the metal film and the sidewall spacers than that of the device isolation regions, resistance-reduced portions of the gate electrodes and resistance-reduced portions of the source and drain regions, wherein the semiconductor layer and the gate electrodes include silicon, the metal film includes one of Ni, Co and Ti, the sidewall spacers are formed of either one of GeCOH and SiBN, and the etchant which has a higher etching selectivity of the unreacted portion of the metal film and the sidewall spacers than that of the device isolation regions, resistance-reduced portions of the gate electrodes and resistance-reduced portions of the source and drain regions is a SPM (sulfuric-acid and hydrogen-peroxide mixture) or APM (ammonia and hydrogen-peroxide mixture).

2. A method for manufacturing a semiconductor device, comprising:

forming a gate electrode on each of a first conductive type active region and a second conductive type active region of a semiconductor layer having device isolation regions in addition to the first and second conductive active regions;

forming a sidewall spacer on each sidewall surface of the gate electrodes formed on the first and second conductive type active regions by using a material different from those of the semiconductor layer, the device isolation regions and the gate electrodes;

forming a blanket film on the semiconductor layer, the device isolation regions, the sidewall spacers and the gate electrodes by using a material different from those of the sidewall spacers;

covering, with a first mask material, a portion of the semiconductor layer where a first conductive type transistor is to be formed;

forming a pair of second conductive type source and drain regions in the first conductive type active region by introducing impurities into the first conductive type active region through the blanket film while using the device isolation regions, the gate electrode formed on the first conductive type active region, the sidewall spacers formed on the sidewall surfaces of the gate electrode and the first mask material as a mask;

covering, with a second mask material, a portion of the semiconductor layer where a second conductive type transistor is to be formed, after removing the first mask material;

forming a pair of first conductive type source and drain regions in the second conductive type active region by introducing impurities into the second conductive type active region through the blanket film while using the device isolation regions, the gate electrode formed on the second conductive type active region, the sidewall spacers formed on the sidewall surfaces of the gate electrode and the second mask material as a mask;

removing the blanket film by using an etchant which has a higher etching selectivity of the blanket film than that of the sidewall spacers, after removing the second mask material;

covering top surfaces of the semiconductor layer, the device isolation regions, the sidewall spacers and the gate electrodes with a metal film;

reducing resistance of the source and drain regions and the gate electrodes partially by making the metal film react with the semiconductor layer and the gate electrodes; and removing an unreacted portion of the metal film and the sidewall spacer simultaneously by using an etchant which has a higher etching selectivity of the unreacted portion of the metal film and the sidewall spacers than that of the device isolation regions, resistance-reduced portions of the gate electrodes and resistance-reduced portions of the source and drain regions, wherein the semiconductor layer and the gate electrodes include silicon, the metal film includes one of Ni, Co and Ti, the sidewall spacers are formed of either one of GeCOH and SiBN, and the etchant which has a higher etching selectivity for the unreacted portion of the metal film and the sidewall spacers than that of the device isolation regions, resistance-reduced portions of the gate electrodes and resistance-reduced portions of the source and drain regions is a SPM (sulfuric-acid and hydrogen-peroxide mixture) or APM (ammonia and hydrogen-peroxide mixture).

3. The method of claim 2, wherein the blanket film is formed of a silicon oxide based material.

4. The method of claim 2, wherein the etchant which has a higher etching selectivity of the blanket film than that of the sidewall spacers is a fluoric acid based etchant.

* * * * *